United States Patent [19]

Umebachi et al.

[11] 4,075,652
[45] Feb. 21, 1978

[54] JUNCTION GATE TYPE GAAS FIELD-EFFECT TRANSISTOR AND METHOD OF FORMING

[75] Inventors: Shotaro Umebachi, Takatsuki; Gota Kano, Nagaoka-Kyo; Morio Inoue, Takatsuki, all of Japan

[73] Assignee: Matsushita Electronics Corporation, Japan

[21] Appl. No.: 793,969

[22] Filed: May 5, 1977

Related U.S. Application Data

[63] Continuation of Ser. No. 567,537, April 14, 1975, abandoned.

[30] Foreign Application Priority Data

Apr. 17, 1974 Japan .................................. 49-44324

[51] Int. Cl.² .................. H01L 29/80; H01L 29/161; H01L 29/06; H01L 29/167
[52] U.S. Cl. ....................................... 357/22; 357/15; 357/16; 357/55; 357/61; 357/63
[58] Field of Search ................ 357/15, 16, 22, 55, 357/61, 63

[56] References Cited

U.S. PATENT DOCUMENTS

| | | | |
|---|---|---|---|
| 3,833,435 | 9/1974 | Logan et al. | 357/22 |
| 3,906,541 | 9/1975 | Goronkin | 357/22 |

*Primary Examiner*—Edward J. Wojciechowicz
*Attorney, Agent, or Firm*—Burgess, Ryan and Wayne

[57] ABSTRACT

The invention discloses a heterojunction Type GaAs field-effect transistor of the type in which a channel region consists of an n-type GaAs layer with a higher mobility and a gate region consists of a p-type $Ga_{1-y}Al_yAs$ layer which is grown heteroepitaxially. The length of the gate is of the order of microns, and a gate, source and drain electrodes are self-aligned. The gate region is etched in the form of a mushroom with the use of an etchant which etched the GaAlAs layer and the Ga-As layer at different etching rates so that the gate, source and drain electrodes may be formed by only one vacuum deposition of a metal such as aluminum.

2 Claims, 2 Drawing Figures

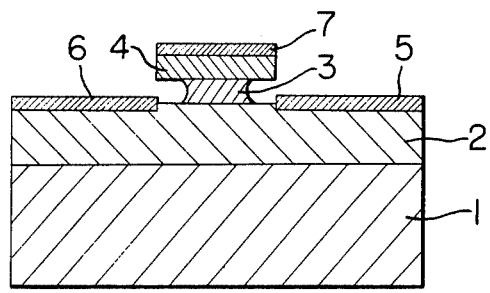
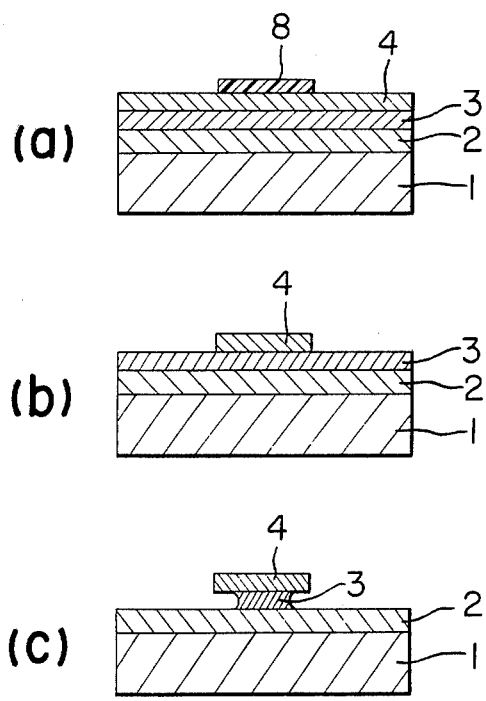

JUNCTION GATE TYPE GAAS FIELD-EFFECT TRANSISTOR AND METHOD OF FORMING

This is a continuation of application Ser. No. 567,537, filed Apr. 14, 1975, now abandoned.

BACKGROUND OF THE INVENTION

The present invention relates to heterojunction type GaAs field-effect transistors of the type in which a gate region consists of a semiconductor layer heteroepitaxially grown upon one major surface of a semiconductor substrate.

There has been a strong demand for field-effect transistors capable of operating at high speeds in a high frequency range so that various electronic computers and control circuits may be operated at high speeds and so that such field-effect transistors may be used in amplifiers for super high frequency television systems and microwave communication systems. Recently, much attention has been devoted to field-effect transistors made of semiconductor compounds with high mobility which are selected from the III and V groups. Among them, most useful field-effect transistors are of the shottky barrier type in which the gate consists of a shottky barrier created upon a GaAs substrate. However, the shottky barrier field effect transistors have undesirable features in that it is difficult to form the shottky barrier, that the thermal stability of the shottky barrier is not satisfactory at high temperatures, and that it is difficult to attain by the conventional masking techniques the correct registration among gate, source and drain required to shorten the distance between the gate and source, and the distance between the gate and drain and to control the length of the gate in order to ensure satisfactory operation at high frequencies.

There has been also devised and demonstrated junction field-effect transistors of the type in which the p-n junction gate is formed within a GaAs substrate by diffusion. However the diffusion speed in the lateral direction along the intersurface between the diffusion mask and the GaAs substrate is faster than the diffusion speed in the longitudinal direction so that the length of the gate must be minimized as much as possible in order to provide field-effect transistors capable of operating at high frequencies. But so far there has not been proposed yet a satisfactory method for shortening the length of the gate.

SUMMARY OF THE INVENTION

One of the objects of the present invention is to provide junction gate type field-effect transistors capable of satisfactorily operating at high frequencies.

Another object of the present invention is to provide junction gate type field-effect transistors with a short gate so that the desired gate characteristics may be obtained.

Another object of the present invention is to provide junction gate type field-transistors which may be formed in a simple manner.

Briefly stated, the field-effect transistor in accordance with the present invention is characterized in that a channel or first layer of one conductivity type is formed upon one major surface of a semiconductor substrate; a gate region or layer of the opposite conductivity type is formed upon the channel or first layer to creat a heterojunction; and a pair of ohmic electrode regions are formed upon the gate region layer and are spaced apart from each other thereby, whereby the conductivity of the channel or first layer may be controlled by the electric field in the heterojunction gate electrode region.

BRIEF DESCRIPTION OF THE DRAWING

FIG. 1 is a schematic sectional view of a junction gate type field-effect transistor with the heterojunction in accordance with the present invention; and FIG. 2 shows the steps of forming junction gate type field-effect transistor in accordance with this invention.

DESCRIPTION OF THE PREFERRED EMBODIMENT

FIG. 1 shows the structure of the heterojunction gate type field-effect transistor in accordance with the present invention generally indicated by 1. To fabricate such a field-effect transistor, a first layer 2, of one conductivity type is formed over the major surface of a substrate consisting of a crystal of intermetallic compound consisting of elements selected from the III and V groups of the periodic table is formed. A second layer 3 of the opposite conductivity type is formed, and over the surface of the first layer by the epitaxial process for creasing the heterojunction with the first layer 2. A third layer 4 of the same conductivity type with that of the second layer 3 is formed over the surface of the second layer 3, the third layer 4 being etched at a slower etching rate than the etching rate by which the second layer 3 was formed. More particularly, the substrate 1 consists of a semi-insulating or p-type GaAs, and over the major surface of the GaAs substrate are sequentially grown by the epitaxial process the first n-type $Ga_{1-x}Al_xAs$ layer where $0 \leq x \leq 0.1$, the second p-type layer 3 consisting of $Ga_{1-y}Al_yAs$ where $0.2 \leq y \leq 0.8$ and the third p-type layer 4 consisting of $Ga_{1-z}Al_zAs$ where $0 \leq z \leq 0.1$. Thereafter the second and third layers 3 and 4 are etched to a desired shape so that a field-effect transistor in which the p-n junction between the first and second layers 2 and 3 is the gate junction may be provided.

In this field-effect transistor, the conductivity in the first layer 2 is controlled by the electric field in the second layer 3.

Next referring to FIG. 2, the steps for forming the field-effect transistor with the above structure will be described in detail hereinafter. In FIG. 2(a), the substrate 1 consists of the Cr-doped Ga—As crystal over the crystal face of (100) of the substrate 1 is grown by the epitaxial process the n-type $Ga_{1-x}Al_xAs$ layer. Over the surface of the first layer 2 is grown also by the epitaxial process the p-type $Ga_{1-y}Al_yAs$ layer 3, and over the surface of the second layer 3 is grown by the epitaxial process the p-type $Ga_{1-z}Al_zAs$ layer.

The first layer 2 has a thickness of from 0.3 to 1 $\mu$, a carrier density of the order between $4 \times 10^{16}$ and $1 \times 10^{17}$ cm$^{-3}$ with the quantity $x$ of Al being $0.1 \geq x \geq 0$, and consists of GaAs ($x = 0$) with a higher electron mobility. This second layer 3 has a thickness between 1 and 2 $\mu$ and a p-type carrier density of the order between $1 \times 10^{17}$ and $1 \times 10^{19}$ cm$^{-3}$, and consists of $Ga_{1-y}Al_yAs$ with $0.8 \geq y \geq 2.0$. The third layer 4 has a thickness between 1 and 2 $\mu$ and a p-type carrier density between $1 \times 10^{17}$ and $1 \times 10^{18}$ cm$^{-3}$ and consists of $Ga_{1-z}Al_zAs$ with $0.1 \geq z \geq 0$.

After the first, second and third layers 2, 3 and 4 are grown over the substrate 1 in the manner described above, a photoresist layer 8 is formed in the conventional manner over the top layer 4 as shown in FIG. 2(a)

so that the gate electrode of the desired configuration may be formed. Thereafter, the substrate 1 with the layers 2, 3, 4 and 8 is immersed into an etchant containing ammonium and hydrogen peroxide so that, as shown in FIG. 2(b), the third layer 4 is removed except for the portion protected by the photoresist layer 8. The remaining portion 4 has a length of 3 μ. Thereafter, the remaining portion 4 is masked, and the second layer 3 is etched by an etchant consisting of a 25% aqueous solution of hydrochloric acid or an aqueous solution containing a hydrochloric acid and phosphoric acid. The remaining portion 4 will not be etched by this etchant. Over-etching of the second layer 3 is carried out so that the second layer 3 is undercut below the remaining portion 4 and becomes shorter than the remaining portion 4 as shown in FIG. 2(c). The remaining second layer portion 3 has a width of the order of about 1 micron, and is in the shape of a mushroom as shown in FIG. 2(c). The first layer 2 is not etched by the etchant used to etch the second layer 3 so that the width of the heterojunction between the first and second layers 2 and 3 is in the order of about 1 micron. Thereafter, the entire wafer is coated by the conventional vacuum deposition process with a thin even coating of a metal such as aluminum, but the undercut portion of the second layer 3 is not coated with a coating of aluminum. Therefore, as shown in FIG. 1, the aluminum coatings 6, 7 and 5 which serve as the electrodes are isolated from each other.

As described above, the method for forming the field-effect transistors in accordance with the present invention includes the selective etching and self-alignment steps, and makes it possible to form in a simple manner the heterojunction gate type field-effect transistors of the type shown in FIG. 1. The field-effect transistor 1 operates as a field-effect transistor with a heterojunction gate when the electrodes 5 and 6 are used as the source and drain electrodes, while the electrode 7 is used as the gate electrode. The gate junction breakdown voltage is higher than 30 volts and the leak current is less than 0.1 nA. Since the length of the gate junction is of the order of 1 micron, the field-effect transistors of the present invention may be advantageously used in various microwave devices.

The conductivity of the substrate and the layers formed thereupon may be changed as the needs demand. For instance, when the first layer 2 is to be made of n-type $Ga_{1-x}Al_xAs$, a p-type GaAs substrate 1 may be used. In order to control the conductivity of each layer, an n-type dopant such as Sn or Te or p-type dopant such as Ge or Zn may be used. It is preferable to mix the desired dopant with a suitable solution so that the dopant may be penetrated into the layer concurrently when the latter is grown by the liquid-phase epitaxial process.

What is claimed is:

1. A junction gate type field-effect transistor comprising a semiconductor substrate of p-type GaAs,
    a semiconductor layer of n-type $Ga_{1-x}Al_xAs$ ($0 \leq x \leq 0.1$),
    a semiconductor gate region of p-type $Ga_{1-y}Al_yAs$ ($0.2 \leq y \leq 0.8$) forming a heterojunction with said n-type layer,
    an electrode region of p-type $Ga_{1-z}Al_zAs$ ($0 \leq z \leq 0.1$) contiguous with said gate region, the width of said gate region being less than the width of said electrode region; and first and second ohmic electrodes disposed of said n-type layer and spaced apart from each other by said gate and electrode regions, whereby the conductivity of said semiconductor layer may be controlled by the electric field across said heterojunction.

2. A junction gate type field-effect transistor as set forth in claim 1 wherein said gate and electrode regions are etched in the form of a mushroom.

* * * * *

UNITED STATES PATENT OFFICE
CERTIFICATE OF CORRECTION

Patent No. 4,075,652   Dated February 21, 1978

Inventor(s) Shotaro Umebachi, et al

It is certified that error appears in the above-identified patent and that said Letters Patent are hereby corrected as shown below:

In the Abstract, line 9: Change "Ga-As" to --GaAs--.

Column 1, line 31: Delete "the".

line 32: Before "gate" insert --the--.

line 66: "creat" should be --create--.

Column 2, line 22: "formed, and over" should be --formed over--.

line 24: Change "creasing" to --creating--.

line 47: "crystal over" should be --crystal. Over--.

line 64: "$Ga_{11-z}$" should be --$Ga_{1-z}$--.

Column 3, line 11: "a" should be deleted.

lines 1-38: The first word on each of these lines is unclear; these words should read as follows:

line 1: --so--.

line 2: --may--.

line 3: --layers--.

UNITED STATES PATENT OFFICE
CERTIFICATE OF CORRECTION

Patent No. 4,075,652     Dated February 21, 1978

Inventor(s) Shotaro Umebachi, et al

It is certified that error appears in the above-identified patent and that said Letters Patent are hereby corrected as shown below:

Unclearly printed words continued:

Column 3, line 4:   --ing--.

line 5:   --shown--.

line 6:   --for-- line 7:   --remaining--.

line 8:   --remaining--.

line 9:   --etched--.

line 10:   --tion--.

line 11:   --taining--.

line 12:   --remaining--.

line 13:   --Over--.

line 14:   --the--.

line 15:   --portion--.

line 16:   --tion--.

UNITED STATES PATENT OFFICE
CERTIFICATE OF CORRECTION

Patent No. 4,075,652                     Dated February 21, 1978

Inventor(s) Shotaro Umebachi, et al

It is certified that error appears in the above-identified patent and that said Letters Patent are hereby corrected as shown below:

Unclearly printed words continued:

Column 3, line 17:   --layer--.

line 18:   --micron--.

line 19:   --FIG--.

line 20:   --used--.

line 21:   --heterojunction--.

line 22:   --and--.

line 23:   --entire--.

line 24:   --position--.

line 25:   --as--.

line 26:   --layer--.

line 27:   --fore--.

line 28:   --8--.

line 29:   --other--.

UNITED STATES PATENT OFFICE
CERTIFICATE OF CORRECTION

Patent No. 4,075,652          Dated February 21, 1978

Inventor(s) Shotaro Umebachi, et al

It is certified that error appears in the above-identified patent and that said Letters Patent are hereby corrected as shown below:

Unclearly printed words continued:

Column 3, line 31:   --effect--.

line 32:   --tion--.

line 33:   --steps--.

line 34:   --the--.

line 35:   --the--.

line 36:   --operates--.

line 37:   --tion--.

UNITED STATES PATENT OFFICE
CERTIFICATE OF CORRECTION

Patent No. 4,075,652     Dated February 21, 1978

Inventor(s) Shotaro Umebachi, et al

It is certified that error appears in the above-identified patent and that said Letters Patent are hereby corrected as shown below:

Unclearly printed words continued:

Column 3, line 38: --source--.

Column 4, line 30: "of" should be --on--.

Signed and Sealed this

Twenty-second Day of August 1978

[SEAL]

Attest:

RUTH C. MASON
Attesting Officer

DONALD W. BANNER
Commissioner of Patents and Trademarks